United States Patent [19]
Shoji

[11] Patent Number: 6,143,125
[45] Date of Patent: Nov. 7, 2000

[54] APPARATUS AND METHOD FOR DRY ETCHING

[75] Inventor: Hideyuki Shoji, Tokyo, Japan

[73] Assignee: NEC Corporation, Tokyo, Japan

[21] Appl. No.: 08/924,282

[22] Filed: Sep. 5, 1997

[30] Foreign Application Priority Data

Sep. 20, 1996 [JP] Japan .................................. 8-249960

[51] Int. Cl.⁷ ................................................ C23C 16/00
[52] U.S. Cl. ........................................ 156/345; 118/723 E
[58] Field of Search .................... 216/60, 70; 156/345; 118/423, 424, 732, 723 R, 723 E; 204/298.31, 298.32, 298.33, 298.34, 298.35, 298.36, 298.37, 298.38, 298.39

[56] References Cited

U.S. PATENT DOCUMENTS

| | | | |
|---|---|---|---|
| 4,030,967 | 6/1977 | Ingrey et al. | 156/643 |
| 4,038,117 | 7/1977 | Noble et al. | 156/646 |
| 4,339,300 | 7/1982 | Noble | 156/601 |
| 4,357,202 | 11/1982 | Rutz | 156/635 |
| 4,957,583 | 9/1990 | Buck et al. | 156/345 |
| 5,198,724 | 3/1993 | Koinuma et al. | 315/111.21 |
| 5,221,421 | 6/1993 | Leibovitz et al. | 156/642 |
| 5,316,617 | 5/1994 | Kawabe et al. | 156/643 |
| 5,413,673 | 5/1995 | Fujimoto | 156/345 |
| 5,502,355 | 3/1996 | Mashiro . | |
| 5,522,932 | 6/1996 | Wong et al. . | |
| 5,549,780 | 8/1996 | Koinuma et al. | 156/345 |
| 5,567,333 | 10/1996 | Hira et al. | 216/22 |
| 5,637,237 | 6/1997 | Oehrlein et al. . | |

FOREIGN PATENT DOCUMENTS

| | | |
|---|---|---|
| 0 128 242 | 11/1983 | European Pat. Off. . |
| 0 128 242 A2 | 11/1983 | European Pat. Off. . |
| 0 458 205 A2 | 5/1991 | European Pat. Off. . |
| 0 673 056 A1 | 3/1995 | European Pat. Off. . |
| 56-122129 | 9/1981 | Japan . |
| 58-213427 | 12/1983 | Japan .......................... H01L 21/302 |
| 59-172236 | 9/1984 | Japan . |
| 63-55939 | 3/1988 | Japan . |
| 63-41987 | 8/1988 | Japan . |
| 1-214025 | 8/1989 | Japan . |
| 3-241740 | 10/1991 | Japan . |
| 5-251399 | 9/1993 | Japan . |
| 5-267235 | 10/1993 | Japan .......................... H01L 21/302 |
| 8-37180 | 2/1996 | Japan . |
| 2 073 942 | 3/1980 | United Kingdom . |
| 2073942 | 3/1980 | United Kingdom . |
| 2315918 | 7/1998 | United Kingdom . |

OTHER PUBLICATIONS

Article from TEL News/SPE, vol. 43, Oct. 1996, pp. 13–14.

*Primary Examiner*—William Krynski
*Assistant Examiner*—B. Shewareged
*Attorney, Agent, or Firm*—Hutchins, Wheeler & Dittmar

[57] ABSTRACT

There is provided an apparatus for carrying out dry etching, including (a) an etching chamber, (b) a pair of electrodes disposed in the etching chamber in facing relation, an object to be etched being placed on one of the electrodes, (c) a plate mounted on the other of the electrodes, the plate being formed with a plurality through-holes, and (d) a pair of enclosures each mounted on each of the electrodes and extending towards the opponent to define a spatial space therebetween in which plasma is generated by introducing a reactive gas thereinto through the through-holes. The enclosures are designed to have a gap therebetween. Both the plate and the enclosures are made of material other than aluminum. The reactive gas is composed only of $CF_4$. Since nothing other than the object is exposed to plasma, it is possible to prevent generation of particles.

15 Claims, 6 Drawing Sheets

APPARATUS AND METHOD FOR DRY ETCHING

BACKGROUND OF THE INVENTION

1. Field of the Invention

The invention relates to an apparatus and a method for dry etching used in fabrication process of a semiconductor device, and more particularly to an apparatus and a method for dry etching a silicon nitride film deposited on a semiconductor substrate.

2. Description of the Related Art

A process of fabricating a semiconductor device generally includes a step of electrically isolating a plurality of semiconductor elements from one another. To this end, there is usually used a method of dry etching a silicon nitride film deposited on a semiconductor substrate.

FIGS. 1A to 1C are partial cross-sectional views of a semiconductor device, illustrating respective steps of a method of dry etching. FIG. 1A illustrates an object to be dry etched. As illustrated in FIG. 1A, the object is comprised of a semiconductor substrate 40, a silicon dioxide film 41 formed on the semiconductor substrate 40 by thermally oxidizing the semiconductor substrate 40, a silicon nitride film 42 formed on the silicon dioxide film 41, and a photoresist 43 formed on the silicon nitride film 42 and patterned by means of photolithography.

As illustrated in FIG. 1B, the silicon nitride film 42 is dry etched by means of a parallel plate type reactive ion etching (RIE) apparatus. Then, the patterned photoresist 43 is removed, followed by thermal annealing. Thereafter, the silicon nitride film 42 and the silicon dioxide film 41 are removed. Thus, there are formed element isolation regions 44 at a surface of the semiconductor substrate 40, as illustrated in FIG. 1C.

There have been employed various etching gases for dry etching the silicon nitride film 42. For instance, followings are used as an etching gas: a gas including fluorocarbon gas, such as $CHF_3/O_2$ and $CF_4/CHF_3$; $SF_6/CHF_3$ suggested in Japanese Unexamined Patent Publication No. 5-251399; $CF_4/H_2$ suggested in Japanese Unexamined Patent Publication No. 56-122129; $CF_4/N_2$ suggested in Japanese Unexamined Patent Publication No. 1-214025; and $CF_4/O_2$ suggested in Japanese Patent Publication No. 63-41987.

The above-mentioned conventional apparatus and method for dry etching has problems as follows.

The first one is as follows. When $CHF_3/O_2$, $CF_4/CHF_3$ or $SF_6/CHF_3$ is used as an etching gas, etching is not balanced with deposit in a semiconductor substrate, since $CHF_3$ gas has a characteristic of deposition. As a result, it would not be possible to have uniformity in etching. According to the results of the experiments the inventor has conducted, it was not possible to have uniformity smaller than ±10% (3 mm edge exclusion) in a 8-inch silicon substrate in the case that a gas including $CHF_3$ was used as an etching gas.

The second problem is that if $CF_4/N_2$ or $CF_4/O_2$ is used for dry etching a silicon nitride film, selectivity between the silicon nitride film and photoresist is reduced because of addition of $N_2$ or $O_2$, which makes it difficult to have desired dimensions. Namely, the use of $CF_4/N_2$ or $CF_4/O_2$ causes difficulty in controlling a dimension in a silicon nitride film to be etched.

The third problem is as follows. A gas supplying plate in an etching chamber in a conventional dry etching apparatus, through which an etching gas is introduced into the etching chamber, is in general made of aluminum or alumite. Hence, there is a problem that when the gas supplying plate is exposed to plasma, aluminum reacts with fluorine contained in an etching gas to thereby unpreferably generate particles. According to the results of the experiments the inventor has conducted, in the case that a gas supplying plate made of aluminum or alumite was used in dry etching with $SF_6/CHF_3$ family gas used as an etching gas, particles had suddenly increased when the total charge time had reached about 40 hours.

The fourth problem is as follows. There are two ways in dry etching a silicon nitride film. One of them is so-called LOCOS process where a silicon dioxide film lying under a silicon nitride film is kept unetched. The other is so-called RECESS process where a silicon nitride film, a silicon dioxide film lying under the silicon nitride film, and a semiconductor substrate disposed under the silicon dioxide film are all etched by 50–70 nm. In the conventional dry etching apparatus and method, it is not possible to commonly use a gas in these two processes.

For instance, if $CHF_3/O_2$ or $CF_4/H_2$ is used as an etching gas, an etching rate for silicon is not obtained in the RECESS process, resulting in lack of mass-productivity.

If $CF_4/CHF_3$ is used as an etching gas in the LOCOS process, only poor uniformity in etching it obtained, as mentioned earlier. The poor etching uniformity makes is difficult to detect an interface between a silicon nitride film and a silicon dioxide film, at which etching should be ceased, and as a result, it would be quite difficult to keep the silicon dioxide film unetched.

If $SF_6/CHF_3$ is used as an etching gas in the RECESS process, an etching rate for a semiconductor substrate or a silicon substrate is quite high, 20 specifically, hundreds of nanometers per a second. Hence, when a semiconductor substrate is to be etched only by tens of nanometers, it would be difficult to control etching with the result of poor reproducibility.

If CF4/N2 or CF4/O2 is used as an etching gas, no problems would be posed about mass-productivity and reproducibility in both LOCOS and RECESS processes, however, a problem about difficulty in controlling dimensions remains unsolved, as mentioned earlier.

There has been suggested a poly-etcher plasma source in TEL NEWS/SPE Vol. 43, October 1996, pp. 13–14. As illustrated in FIG. 3, the suggested plasma source includes a process chamber, top and bottom matchers, RF generators electrically connected to the top and bottom matchers, respectively, and an IEM (Ion Energy Modulation) controller electrically connected to the RF generators and detectors. It is said that middle density plasma with high stability can be obtained.

SUMMARY OF THE INVENTION

In view of the foregoing problems of the conventional dry etching apparatus and method, it is an object of the present invention to provide an apparatus and a method for dry etching which are capable of providing preferable etching uniformity, etched shape, and etching reproducibility in both the LOCOS and RECESS processes, preventing generation of particles, and providing mass-productivity.

In one aspect, there is provided an apparatus for carrying out dry etching, including a pair of electrodes spaced away from each other by a certain distance and defining therebetween a space in which plasma is generated by introducing a reactive gas thereinto, the space being defined by material other than aluminum.

Since the space in which plasma is generated is made of material containing no aluminum, it would be possible to prevent generation of particles.

It is preferable that the reactive gas is composed only of $CF_4$ gas. The use of $CF_4$ gas ensures preferable etching uniformity, etched shape, etching reproducibility, and mass-productivity.

The above-mentioned dry etching apparatus may further include a pair of enclosures each mounted on each of the electrodes and extending towards the opponent to define the spatial space therebetween, the enclosures being arranged to have a gap therebetween. A smaller region other than the object to be etched would be exposed to plasma, ensuring less generation of particles. It is preferable that the enclosures are in the form of a ring. The cover may be made of any material other than aluminum. It is preferable that one of the enclosures mounted on one of the electrodes together with an object to be etched may be made of the same material as that of the object. For instance, if the object is a silicon substrate, the one of the enclosures is preferably made of silicon. The other of the enclosures may be made of any material other than aluminum. For instance, the other of the enclosures may be made of organic material such as polyimide.

The above-mentioned dry etching apparatus may further include a plate mounted on one of the electrodes. The plate is formed with a plurality of through-holes through which the reactive gas is introduced into the spatial space. The plate may be made of any material other than aluminum. For instance, the plate may be made of silicon.

The above mentioned dry etching apparatus may further include a high frequency voltage source which supplies a voltage having a frequency of 13.56 MHz to one of the electrodes on which an object to be etched is placed.

The above-mentioned dry etching apparatus may further include a temperature controller for keeping the electrodes at a desired temperature. It is preferable that the temperature controller keeps the electrodes to have a common temperature in the range of 30° C. to 50° C. both inclusive.

The above-mentioned dry etching apparatus may further include an etching controller which detects when etching should be ceased. Namely, the etching controller acts as an end point detector (hereinafter, referred to simply as "EPD". For instance, the etching controller or EPD may judge when etching should be ceased by monitoring an alteration in a light emission intensity of a light having a wavelength of 388 nm. Since alteration in light emission intensity of a light having a wavelength of 388 nm is greater than a light having a wavelength other than 388 nm, it would be possible to accurately detect the time when etching should be ceased.

There is further provided an apparatus for carrying out dry etching, including (a) an etching chamber, (b) a pair of electrodes disposed in the etching chamber in facing relation, an object to be etched being placed on one of the electrodes, (c) a plate mounted on the other of the electrodes, the plate being formed with a plurality through-holes, and (d) a pair of enclosures each mounted on each of the electrodes and extending towards the opponent to define a space therebetween in which plasma is generated by introducing a reactive gas thereinto through the through-holes, the enclosures being arranged to have a gap therebetween. Both the plate and the enclosures are made of material other than aluminum.

In another aspect, there is provided a method of carrying out dry etching, including the step of generating plasma by introducing a reactive gas into a spatial space defined by material other than aluminum.

It is preferable that the reactive gas is composed only of $CF_4$ gas. Plasma may be generated by supplying a voltage having a frequency of 13.56 MHz to electrodes.

It is preferable that the electrodes are kept at a desired temperature. It is also preferable that the electrodes are controlled to have a common temperature in the range of 30° C. to 50° C. both inclusive. For instance, the time when etching should be ceased may be judged by monitoring an alteration in a light emission intensity of a light having a wavelength of 388 nm.

The apparatus and method for dry etching in accordance with the present invention provides the following advantages.

Firstly, it is possible to obtain preferable etching uniformity, since only $CF_4$ gas is used as a reactive gas.

Secondly, it is possible to obtain etched shape and etching reproducibility more preferable than those of prior art both in the LOCOS and RECESS processes.

Thirdly, it is possible to prevent generation of particles, since the spatial space to be exposed to plasma is defined by material other than aluminum.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1A:
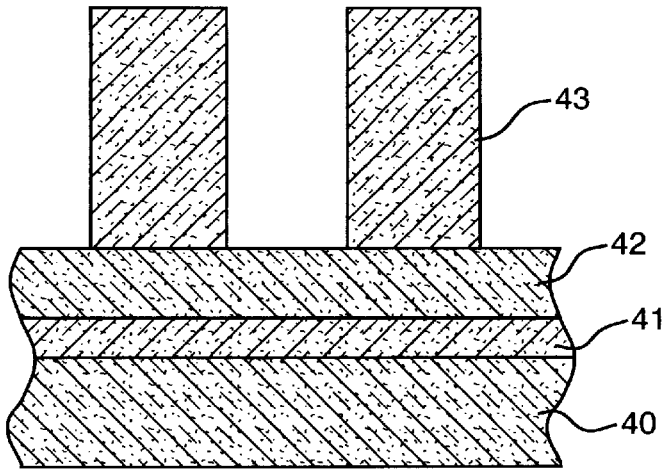
FIGS. 1A to 1C are cross-sectional views of a semiconductor device, illustrating respective steps of a conventional method for dry etching.
Figure 1B:
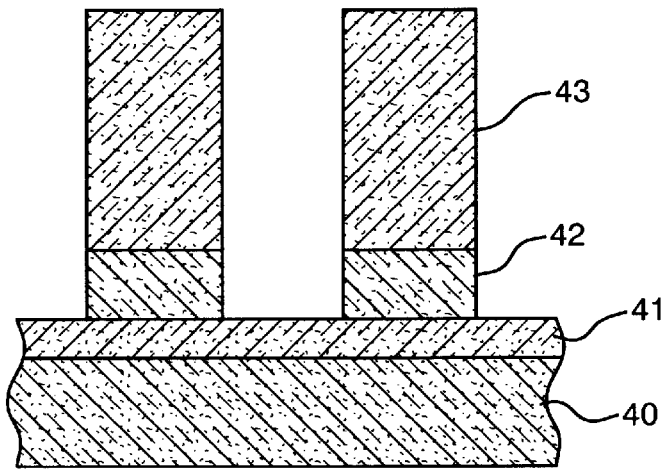
Figure 1C:
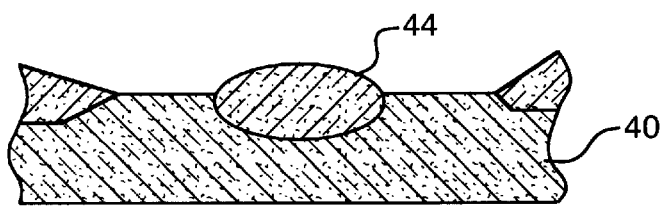
Figure 2:
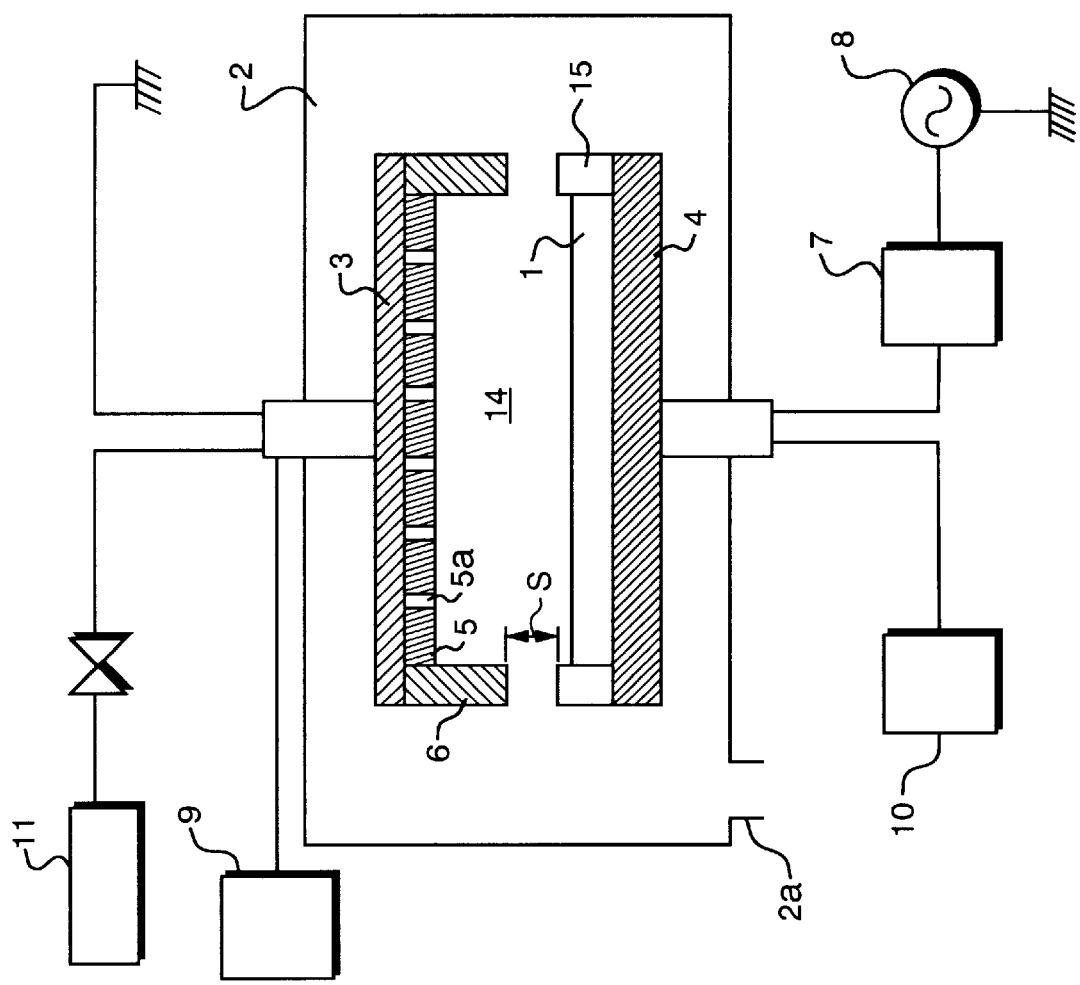
FIG. 2 is a schematic view illustrating a dry etching apparatus in accordance with the preferred embodiment of the invention.

FIG. 2 illustrates a dry etching apparatus in accordance with the first embodiment of the present invention. As illustrated in FIG. 2, the dry etching apparatus includes an etching chamber 2 in which an object 1 to be etched, such as a silicon substrate, is placed. Inside the etching chamber 2, upper and lower electrodes 3 and 4 are spaced away from each other in facing relation. The upper and lower electrodes 3 and 4 define a space 14 therebetween. The etching chamber 2 is formed with an exhaust port 2a.

A gas supplying plate 5 is attached to the upper electrode 3. The gas supplying plate 5 is formed with a plurality of through-holes 5a through which a reactive gas is introduced into the etching chamber 2. A ring-shaped anode cover 6 is also attached to the upper electrode 3, surrounding the gas supplying plate 5 therewith. The anode cover 6 extends towards the lower electrode 4. A ring-shaped cathode cover 15 is attached to the lower electrode 4, surrounding the object 1 therewith. The cathode cover 15 extends towards the upper electrode 3. The anode and cathode covers 6 and 15 cooperate with each other to confine plasma into the spatial space 14.

As illustrated, a gap S is formed between the anode cover 6 and the cathode cover 15. Though it depends on a size of a dry etching apparatus, it is preferable that the gap S is in the range of 1 to 5 mm both inclusive, and more preferable that the gas S is in the range of 1 to 3 mm both inclusive. If the gap S is greater than 5 mm, an inner wall is unpreferably exposed to plasma generated in the space 14. The reactive gas having been introduced into the space 14 from a later mentioned gas supplier 11 and reacted for etching the object 1 is exhausted through the gap S into the etching chamber 2, and then further exhausted through the exhaust port 2a out of the etching chamber 2.

A high frequency power source 8 is electrically connected to the lower electrode 4 through a matching box 7. The high frequency power source 8 transmits a voltage having a frequency of 13.56 MHz. The object 1 to be etched is placed on the lower electrode 4. Chillers 9 and 10 are electrically connected to the upper and lower electrodes 3 and 4, respectively, for controlling a temperature of the upper and lower electrodes 3 and 4.

In the dry etching apparatus in accordance with the instant embodiment, the space 14 which is exposed to plasma is defined by material containing no aluminum. Specifically, the gas supplying plate 5 is made of silicon, and the anode cover 6 is made of organic material such as polyimide, and the cathode cover 15 is made of the same material as that of the object 1. If the object 1 is a silicon substrate, the cathode cover 15 is also made of silicon. Though the gap S is formed between the anode and cathode covers 6 and 15, the gap S is designed so small that plasma generated in the spatial space 14 does not reach an inner wall of the etching chamber 2.

A reactive gas used in the instant embodiment is composed only of $CF_4$ gas. The reactive gas, that is, $CF_4$ gas is supplied from a gas supplier 11 to the etching chamber 2 through the through-holes 5a of the gas supplying plate 5.

Figure 3:
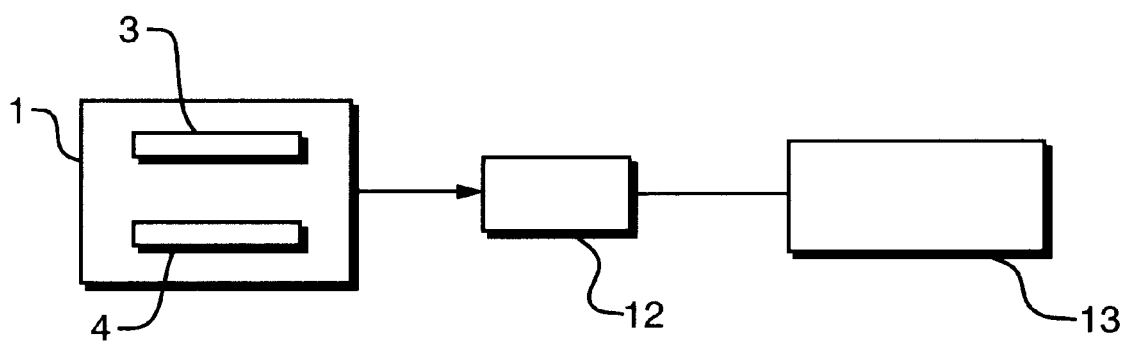
FIG. 3 is a schematic view illustrating an etching controller.

As illustrated in FIG. 3, the dry etching apparatus further includes an optical sensor 12 and an etching controller or end point detector (EPD) 13. The optical sensor 12 detects an intensity of a light having a wavelength of 388 nm among lights generated in plasma, and transmits a signal indicative of the intensity to the etching controller 13. The etching controller or EPD 13 judges the time when etching should be stopped, based on the signals transmitted from the optical sensor 12. Herein, the wavelength of 388 nm is a wavelength of CN. Since alteration in light emission intensity of a light having a wavelength of 388 nm is greater than a light having a wavelength other than 388 nm, it is possible to accurately detect the time when etching is completed.

Figure 4A:
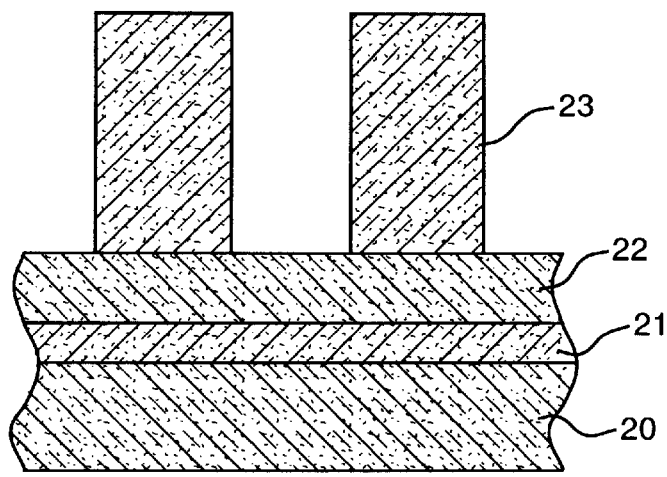
FIGS. 4A to 4C are cross-sectional views of a semiconductor device, illustrating respective steps of a method for dry etching in LOCOS process in accordance with another preferred embodiment of the invention.
Figure 4B:
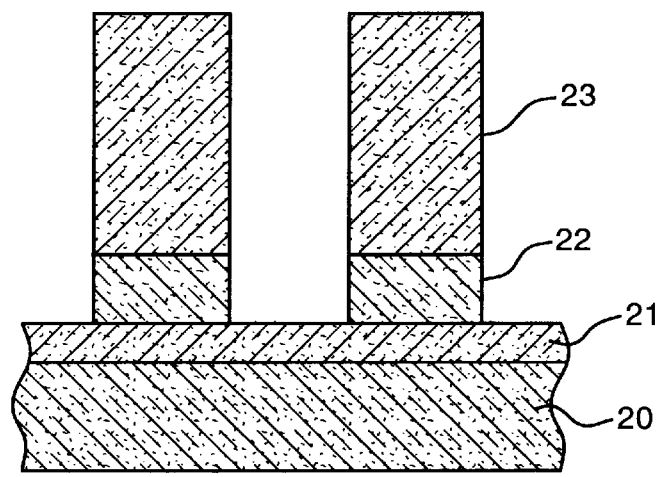
Figure 4C:
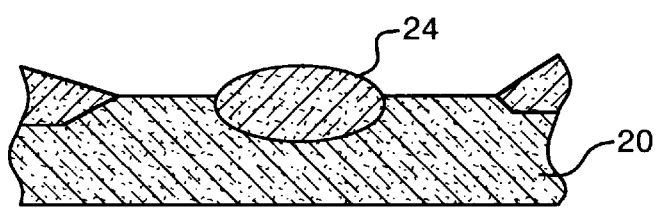

FIGS. 4A to 4C illustrate respective steps of a method for dry etching in LOCOS process. FIG. 4A illustrates the object 1 to be dry etched. As illustrated in FIG. 4A, the object 1 is comprised of a semiconductor substrate 20, a silicon dioxide film 21 formed on the semiconductor substrate 20 by thermally oxidizing the semiconductor substrate 20, and having a thickness of about 40 nm, a silicon nitride film 22 formed on the silicon dioxide film 21, having a thickness of about 120 nm, and a photoresist 23 formed on the silicon nitride film 22, and patterned by means of photolithography.

The object 1 is dry etched by means of the dry etching apparatus illustrated in FIG. 2. Etching conditions are determined in the following ranges.

$CF_4$: 50–100 sccm

Pressure: 10–20 Pa

RF power density: 1.23–1.85 W/cm$^2$

First, as illustrated in FIG. 4B, the silicon nitride film 22 is dry etched. While the silicon nitride film 22 is being etched, the etching controller or end point detector 13 monitors how much degree the dry etching proceeds, based on the signals transmitted from the optical sensor 12 monitoring a light having a wavelength of 388 nm. As mentioned later, when an intensity of the light suddenly varies, the etching controller 13 judges it is time for the dry etching to finish, and stops the dry etching apparatus to operate, for instance, by closing the gas supplier 11 and stopping the high frequency power source 8. By virtue of the etching controller 13, it is possible to stop the dry etching when the etching reaches an interface between the silicon nitride film 22 and the silicon dioxide film 21, as illustrated in FIG. 4B.

Then, the patterned photoresist 23 is removed, followed by thermal annealing. Thereafter, the silicon nitride film 22 and the silicon dioxide film 21 are removed. Thus, there are formed element isolation regions 24 at a surface of the semiconductor substrate 20, as illustrated in FIG. 4C.

With respect to the etching of the silicon nitride film 22, if the silicon nitride film 22 were further etched for 20–30 seconds under the following conditions, there would remain no residue of the silicon nitride film 22.

$CF_4$: 50–100 sccm

Pressure: 10–20 Pa

RF power density: 0.31–0.62 W/cm$^2$

While the object 1 is being dry etched in the dry etching apparatus, the chillers 9 and 10 keeps the upper and lower electrodes 3 and 4 at the same temperature in the range of 30° C. to 50° C. both inclusive. This ensures that the silicon nitride film 22 is vertically etched, that deposits are suppressed from being produced in the etching chamber 2, and that the anode cover 6 is protected from high temperature.

Figure 5A:
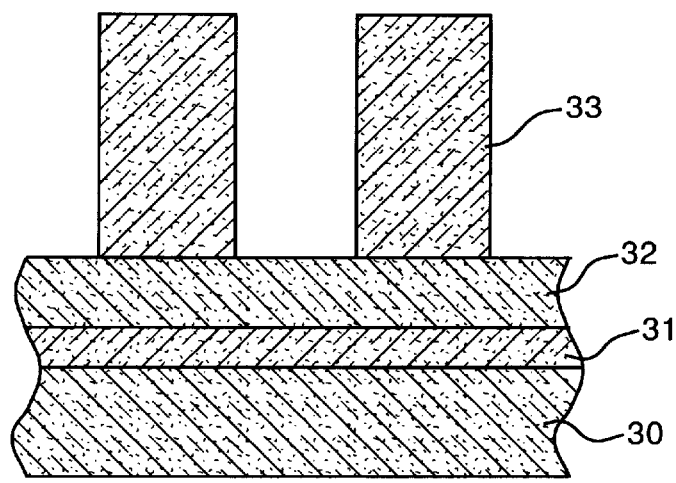
FIGS. 5A to 5C are cross-sectional views of a semiconductor device, illustrating respective steps of a method for dry etching in RECESS process in accordance with still another preferred embodiment of the invention.
Figure 5B:
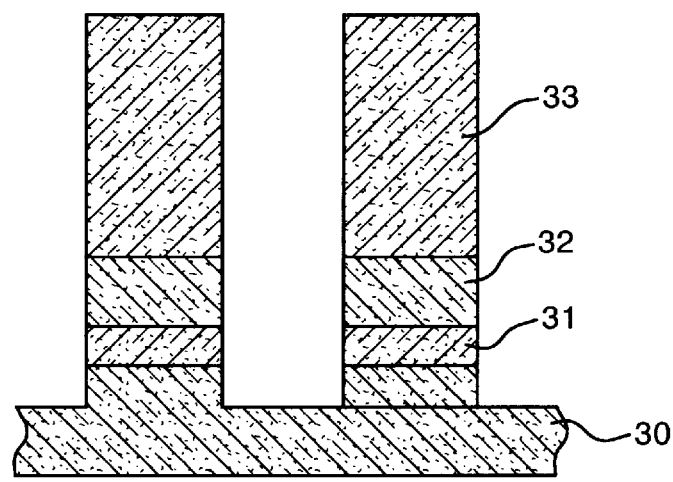
Figure 5C:
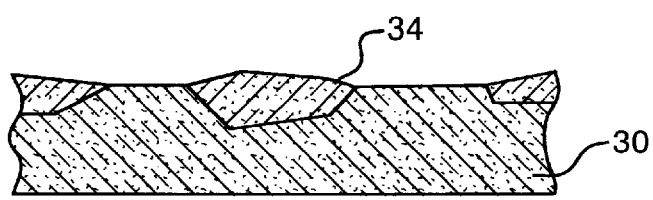

FIGS. 5A to 5C illustrate respective steps of a method for dry etching in RECESS process. FIG. 5A illustrates the object 1 to be dry etched. As illustrated in FIG. 5A, the object 1 is comprised of a semiconductor substrate 30, a silicon dioxide film 31 formed on the semiconductor substrate 30 by thermally oxidizing the semiconductor substrate 30, and having a thickness of about 40 nm, a silicon nitride film 32 formed on the silicon dioxide film 31, having a thickness of about 120 nm, and a photoresist 33 formed on the silicon nitride film 32, and patterned by means of photolithography.

The object 1 is dry etched by means of the dry etching apparatus illustrated in FIG. 2. Etching conditions are determined in the following ranges.

$CF_4$: 50–100 sccm

Pressure: 10–20 Pa

RF power density: 1.23–1.85 W/cm$^2$

First, as illustrated in FIG. 5B, the silicon nitride film 32, the silicon dioxide film 31 and the semiconductor substrate 30 are dry etched. While the silicon nitride film 32, the silicon dioxide film 31 and the semiconductor substrate 30 are being etched, the etching controller 13 monitors how much degree the dry etching proceeds, based on the signals transmitted from the optical sensor 12 monitoring a light having a wavelength of 388 nm.

Figure 6:
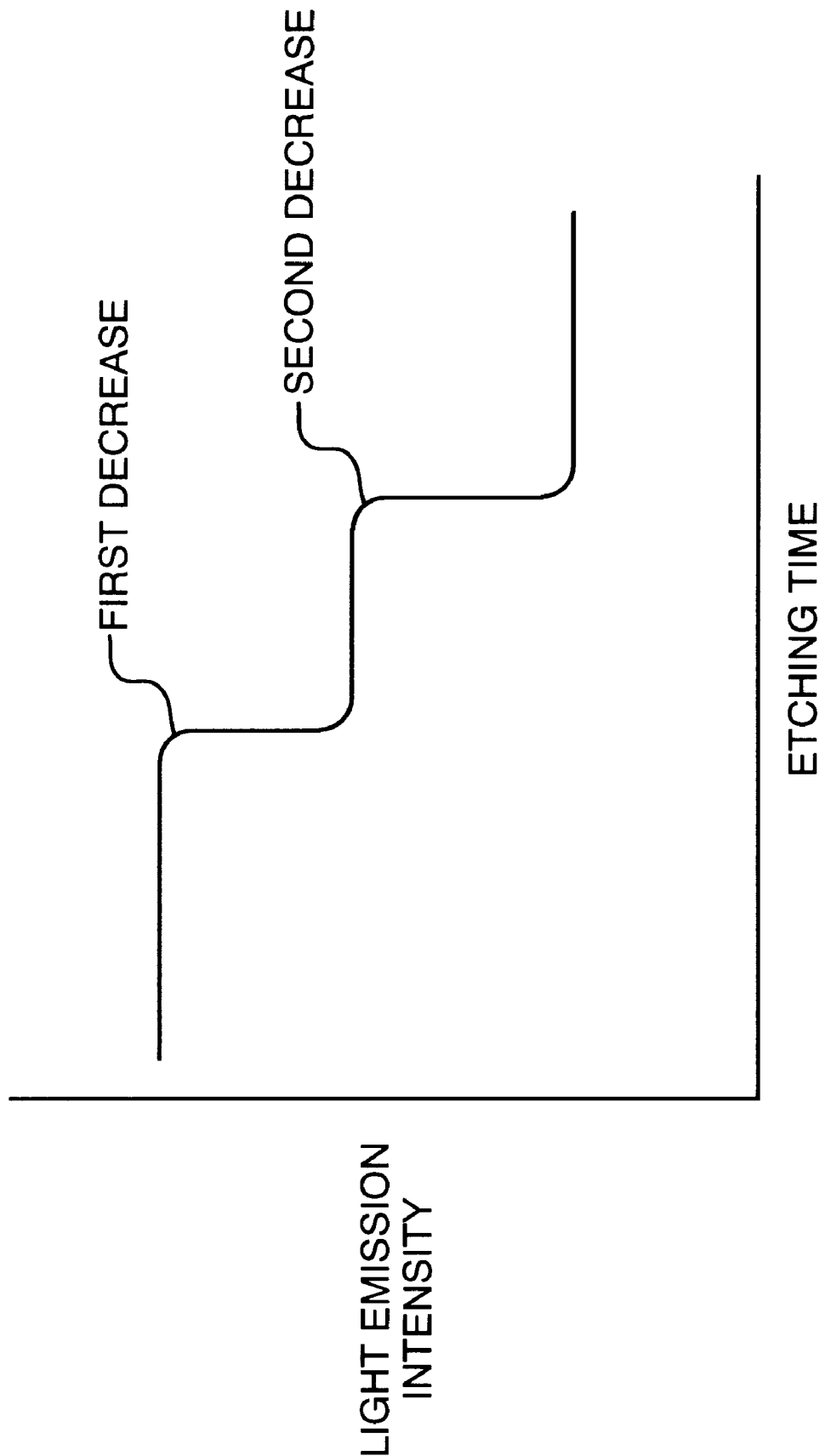
FIG. 6 is a graph showing how a light emission intensity varies with the lapse of time.

FIG. 6 is a graph showing how an intensity of a light having a wavelength of 388 nm varies with the lapse of time in the case that dry etching is carried out under the above-mentioned conditions. As is obvious in FIG. 6, the intensity suddenly decreases twice. It is understood that the first sudden decrease occurs at an interface between the silicon nitride film 32 and the silicon dioxide film 31, and the second sudden decrease occurs at an interface between the silicon dioxide film 31 and the semiconductor substrate 30. The etching controller 13 monitors how the light emission intensity varies, based on the signals transmitted from the optical sensor 12. By virtue of the etching controller 13, it is possible to dry etch the silicon nitride film 32, the silicon dioxide film 31 and the semiconductor substrate 30 by a desired depth.

For instance, an etching rate of silicon is about 80 nm/min under the following conditions.

$CF_4$: 75 sccm
Pressure: 10 Pa
RF power density: 1.23 W/cm$^2$

Accordingly, if etching were carried out for 45 seconds after the second sudden decrease in an intensity of the light has occurred, the semiconductor substrate 30 would be etched by 60 nm, as illustrated in FIG. 5B.

Then, the patterned photoresist 23 is removed, followed by thermal annealing. Thereafter, the silicon nitride film 32 and the silicon dioxide film 31 are removed. Thus, there are formed element isolation regions 34 at a surface of the semiconductor substrate 30, as illustrated in FIG. 5C.

While the object 1 is being dry etched in the dry etching apparatus, the chillers 9 and 10 keeps the upper and lower electrodes 3 and 4 at the same temperature in the range of 30° C. to 50° C. both inclusive, similarly to the LOCOS process illustrated in FIGS. 4A to 4C. This ensures that the silicon nitride film 32 is vertically etched, that deposits are suppressed from being produced in the etching chamber 2, and that the anode cover 6 is protected from high temperature.

Since only $CF_4$ gas is used as a reactive gas in the dry etching apparatus and method in accordance with the present invention, there can be obtained preferable uniformity in etching. According to the results of the experiments the inventor has conducted, it was possible to have uniformity smaller than about ±3% (3 mm edge exclusion) in a 8-inch silicon substrate.

It is also possible to have more preferable etched shape and etching reproducibility than those of prior art both in LOCOS and RECESS processes, which ensures mass-productivity.

In addition, it is possible to prevent generation of particles, because the spatial space exposed to plasma is defined by material containing no aluminum. According to the results of the experiments which the inventor has conducted, the particle problem had not occurred for more than 100 hours as total charging time for an 8-inch silicon substrate. This shows that the dry etching apparatus and method in accordance with the present invention is quite effective for prevention of generation of particles.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-249960 filed on Sep. 20, 1996 including specification, claims, drawings and summary is incorporated herein by reference in its entirety.

What is claimed is:

1. An apparatus for carrying out dry etching, comprising: a pair of electrodes spaced away from each other by a certain distance and defining therebetween a space in which plasma is generated by introducing $CF_4$ gas thereto, said space being defined by the pair of electrodes and a pair of opposing enclosures, each enclosure mounted on one of said electrodes and extending toward the opposite enclosure, said enclosures being arranged to have a gap therebetween, wherein a first enclosure of said pair of enclosures mounted on one of said electrodes together with an object to be etched is made of the same material as said object to be etched, and wherein the second of said enclosures is made of an organic material.

2. The apparatus as set forth in claim 1, wherein said enclosures are in the form of a ring.

3. The apparatus as set forth in claim 1, wherein the gap between said enclosures is in the range from 1 to 3 mm.

4. The apparatus as set forth in claim 3, further comprising a plate mounted on one of said electrodes, said plate being formed with a plurality of through-holes through which said $CF_4$ gas is introduced in said space, said plate being made of silicon.

5. The apparatus as set forth in claim 1, further comprising a high frequency voltage source supplying a voltage having a frequency of 13.56 MHz to one of said electrodes on which an object to be etched is placed.

6. An apparatus for carrying out dry etching, comprising:
a pair of electrodes spaced away from each other by a certain distance and defining therebetween a space in which plasma is generated by introducing a reactive gas thereto;
said space being defined by the pair of electrodes and a pair of opposing enclosures, each enclosure mounted on one of said electrodes and extending toward the opposite enclosure;
said enclosures being arranged to have a gap therebetween, wherein a first enclosure of said pair of enclosures mounted on one of said electrodes together with an object to be etched is made of the same material as said object to be etched;
wherein a temperature controller keeps said electrodes to have a common temperature in the range from 30° C. to 50° C.

7. An apparatus for carrying out dry etching, comprising:
a pair of electrodes spaced away from each other by a certain distance and defining therebetween a space in which plasma is generated by introducing a reactive gas thereto;
said space being defined by the pair of electrodes and a pair of opposing enclosures, each enclosure mounted on one of said electrodes and extending toward the opposite enclosure;
said enclosures being arranged to have a gap therebetween, wherein a first enclosure of said pair of enclosures mounted on one of said electrodes together with an object to be etched is made of the same material as said object to be etched;
wherein an etching controller judges when etching should be ceased by monitoring an alteration in a light emission intensity of a light having a wavelength of 388 nm.

8. An apparatus for carrying out dry etching, comprising:
(a) an etching chamber;
(b) a pair of electrodes disposed in said etching chamber in facing relation, an object to be etched being placed on one of said electrodes;

(c) a plate mounted on the other of said electrodes, said plate being formed with a plurality of through-holes; and (d) a pair of opposing enclosures, each enclosure mounted on one of said electrodes and extending towards the other of the opposing electrodes to define a space therebetween in which plasma is generated by introducing $CF_4$ gas thereinto through said plurality of through-holes, said enclosures being arranged to have a gap therebetween, wherein a first enclosure of said pair of enclosures which is mounted on the electrode on which the object to be etched is placed, is made of the same material as the object to be etched.

9. The apparatus as set forth in claim 8, wherein said plate is made of silicon.

10. The apparatus as set forth in claim 8, wherein said enclosures are in the form of a ring.

11. The apparatus as set forth in claim 8, wherein the second enclosure of said pair of enclosures is made of an organic material.

12. The apparatus as set forth in claim 8, wherein said gap between said enclosures is in the range from 1 to 5 mm.

13. The apparatus as set forth in claim 8, further comprising a high frequency voltage source supplying a voltage having a frequency of 13.56 MHz to said one of said electrodes on which said object to be etched is placed.

14. An apparatus for carrying out dry etching, comprising:

(a) an etching chamber;

(b) a pair of electrodes disposed in said etching chamber in facing relation, an object to be etched being placed on one of said electrodes;

(c) a plate mounted on the other of said electrodes, said plate being formed with a plurality through-holes; and (d) a pair of opposing enclosures, each enclosure mounted on one of said electrodes and extending towards the other of the opposing electrodes to define a space therebetween in which plasma is generated by introducing a reactive gas thereinto through said through-holes, said enclosures being arranged to have a gap therebetween, wherein a first enclosure of said pair of enclosures which is mounted on the electrode on which the object to be etched is placed, is made of the same material as the object to be etched;

wherein a temperature controller keeps said electrodes to have a common temperature in the range from 30° C. to 50° C.

15. An apparatus for carrying out dry etching, comprising:

(a) an etching chamber;

(b) a pair of electrodes disposed in said etching chamber in facing relation, an object to be etched being placed on one of said electrodes;

(c) a plate mounted on the other of said electrodes, said plate being formed with a plurality through-holes; and (d) a pair of opposing enclosures, each enclosure mounted on one of said electrodes and extending towards the other of the opposing electrodes to define a space therebetween in which plasma is generated by introducing a reactive gas thereinto through said through-holes, said enclosures being arranged to have a gap therebetween, wherein a first enclosure of said pair of enclosures which is mounted on the electrode on which the object to be etched is placed, is made of the same material as the object to be etched;

wherein an etching controller judges when etching should be ceased by monitoring an alteration in a light emission intensity of a light having a wavelength of 388 nm.

* * * * *